United States Patent [19]
Lin et al.

[11] Patent Number: 6,108,242
[45] Date of Patent: Aug. 22, 2000

[54] FLASH MEMORY WITH SPLIT GATE STRUCTURE AND METHOD OF FABRICATING THE SAME

[75] Inventors: Chrong-Jung Lin, Taipei Hsien; Hsin-Ming Chen, Tainan Hsien, both of Taiwan

[73] Assignee: Taiwan Semiconductor Mfg. Co. Ltd., Hsinchu, Taiwan

[21] Appl. No.: 09/371,702

[22] Filed: Aug. 10, 1999

[51] Int. Cl.⁷ .................................................. G11C 7/00
[52] U.S. Cl. ............................ 365/185.33; 365/185.29; 365/51
[58] Field of Search .................. 365/185.33, 185.29, 365/51

[56] References Cited

U.S. PATENT DOCUMENTS 5,070,032  12/1991  Yuan ................................ 365/185.33

Primary Examiner—Terrell W. Fears
Attorney, Agent, or Firm—J.C. Patents; Jiawei Huang

[57] ABSTRACT

A flash memory with a split gate. The flash memory is formed on a semiconductor substrate, comprising a channel region, a tunnel oxide layer, a floating gate, a control gate, a dielectric layer and two source/drain regions. The channel region is located on a surface of the semiconductor substrate and partly covered by the floating gate. The floating gate is funnelform, that is, having a gradually diffusing cross sectional profile from a bottom surface to a top surface, and has a tunnel oxide layer to isolate with the semiconductor substrate, and there is an annulus tip on the rim of the top surface. The dielectric layer is located on a part of the top surface and a sidewall of the floating gate and a part of the channel region uncovered by the floating gate. The control gate is formed on the dielectric layer, and the source/drain regions are formed in the semiconductor at both sides of the channel region. The flash memory further comprises a reverse triangular doped region is formed by a delta doping step, and therefore, the source line capacitance is reduced to be advantageous to anti-punch through effect. Further, compared to conventional method, the annulus tip with a sharper profile has a greatly improved operation speed with a reduced erasure voltage.

8 Claims, 4 Drawing Sheets

FLASH MEMORY WITH SPLIT GATE STRUCTURE AND METHOD OF FABRICATING THE SAME

BACKGROUND OF THE INVENTION

1. Field of the Invention

The invention relates in general to a structure and a fabricating method of a flash memory with a split gate structure. More particularly, this invention relates a flash memory with split gate structure and having a low erasing voltage and a high erasing speed.

2. Description of the Related Art

In the conventional erasable programmable read only memory (EPROM), a structure similar to an N-type metal oxide semiconductor (NMOS) is formed. A stacked gate comprising a polysilicon floating gate for charge storage and a control gate to control the charge storage is typically applied. Thus, a conventional EPROM has two gates, that is, a floating gate under a control gate. The control gate is connected to a word line, while the floating gate is like a floating island without connecting to another wires or components.

FIG. 1 shows a circuit layout of a conventional flash memory. In a local structure of the memory array, the flash memory on each row has a control gate electrically connected to an identical word line. For example, the control gate G of the flash memory 10 is connected to the word line WL2, while the word line WL1 is connected to the control gate of another row of the memory array. On each column, each flash memory has a source region electrically connected to an identical bit line. For example, the source region S is electrically connected to the bit line BL1, while the drain of each flash memory is electrically connected to another bit line. In this figure, the drain region D on this column is connected to another bit line BL2. Normally, the bit line BL1, the bit line BL2 and the bit line BL3 are distributed in parallel, and perpendicular to the word lines WL1 and WL2 to compose a flash memory array.

In FIG. 2, a schematic drawing of a cross section of a flash memory is shown. On a semiconductor substrate 20, a thin tunnel oxide layer 22 is formed. A floating gate 24 is formed on the tunnel oxide 22. A dielectric layer 26 is formed on the floating gate 24, and a control gate 28 is formed on the dielectric layer 26 to connect an external gate voltage G. In addition, at both sides of the control gate 28 and the floating gate 24, diffusion regions including a source region 30a and a drain region 30b are formed. The source region 30b is connected to an external source voltage S, while the drain region 30a is connected to an external drain voltage D. The drain region 30a is spaced from the floating gate 24 with a distance, that is, a part of a channel region 32 between the drain region 30a and the floating gate 24 is not covered by the floating gate 24, but covered by the control gate 28. Thus, a split gate is formed to have the floating gate 24 and the control gate 28 covering different portions of the channel region 32. The layout of the split gate structure can enhance the operation speed of a flash memory While programming a flash memory with a split gate, the gate voltage G is high, the source voltage S is high, and the drain voltage D is low. Hot electrons are injected into the floating gate 24. While performing an erasing operation, the tunneling effect occurs between the floating gate 24 and the control gate 28. To reduce the erasing voltage and the increase the erasing speed, a tip is normally formed on the floating gate 24. The conventional method of forming a tip 34 includes using a local oxidation (LOCOS) to form an oxide layer 36 with a bird's beak on the floating gate.

Although the formation of an oxide layer with a bird's beak is advantageous to reduce the erasing voltage and increasing the erasing speed, the wet oxidation method has limitation in reducing linewidth. Therefore, for a highly integrated device, the method can not be applied. In addition, the thermal process used in the local oxidation lowers the thermal budget in the subsequent process, so that the process window is reduced.

SUMMARY OF THE INVENTION

The invention provides a flash memory with a split gate structure. The flash memory is formed on a semiconductor substrate and comprises at least a channel, a floating gate, a control gate, a dielectric layer and two source/drain regions. The channel region is formed on a surface of the substrate and is partly covered by the floating gate. Between the floating gate and the semiconductor substrate, a tunnel oxide layer is formed. The floating gate has a funnel shape with a bottom surface smaller than a top surface. An annulus tip is formed on a rim of the top surface. The dielectric layer is formed on a part of the top surface and a sidewall of the floating gate. The control gate is formed on the dielectric layer, including positions over the sidewall and the top surface of the floating gate, and a surface of the channel region which is not covered by the floating gate. The source/drain regions are formed at two sides of the channel region.

In one embodiment of the invention, a method of fabricating the flash memory with a split gate structure is provided. A first and a second insulation regions are formed and patterned to form first insulation blocks and second insulation blocks on the substrate, while the substrate having an exposed surface between each pair of the first and the second insulation blocks. A spacer with a slope is formed on each sidewall of the first and the second insulation blocks. A delta doping step is performed on the exposed sidewall to form an anti-punch through doped region. A tunneling oxide is formed on each of the exposed surface of the substrate. A first polysilicon layer is formed to fill each spacer on the tunneling oxide between the neighboring first and second insulation blocks to serve as a floating gate. The second insulation blocks and spacers thereon are removed to expose a part of the substrate between two neighboring floating gates and a sidewall. A conformal dielectric layer is formed along the exposed part of the substrate, surfaces of the floating gate and the first insulation blocks. A second polysilicon layer is formed on the dielectric layer. The second polysilicon layer and the dielectric layer are patterned to cover a top surface of the floating gate and the exposed sidewall, while the other side of the floating gate has another sidewall covered by the spacer. The first insulation blocks are then removed to further expose another part of the substrate between two neighboring spacers. A doping step is performed to form diffusion regions in the substrate at two sides of the floating gates.

Due to the formation of the spacer, the delta doped region has a reverse triangular profile which is advantageous to the reduction of junction capacitance. On the other hand, the effect of punchthrough between the source region and the drain region while programming with an applied source line voltage is effectively prevented. Furthermore, a sharper annulus tip is formed at a rim of the floating gate without going through a thermal process. As a consequence, the erasing voltage is decreased and the erasing speed is increased without suffering from the integration limitation and thermal budget.

Both the foregoing general description and the following detailed description are exemplary and explanatory only and are not restrictive of the invention, as claimed.

DESCRIPTION OF THE PREFERRED EMBODIMENTS

Figure 1:
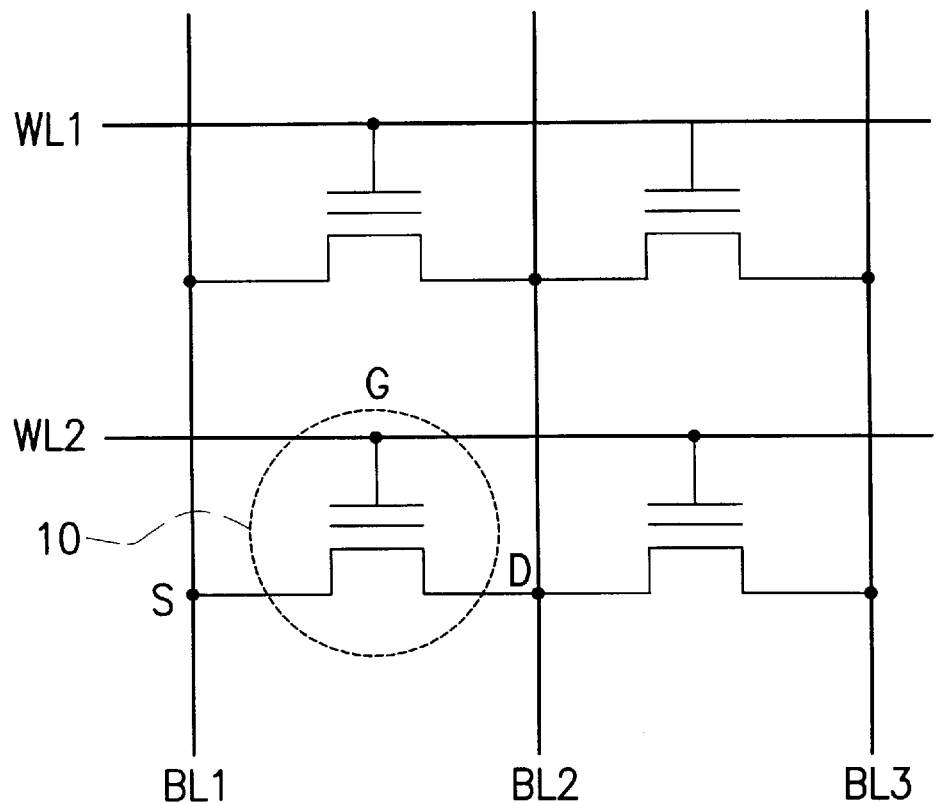
FIG. 1 shows a circuit layout of a conventional flash memory.
Figure 2:
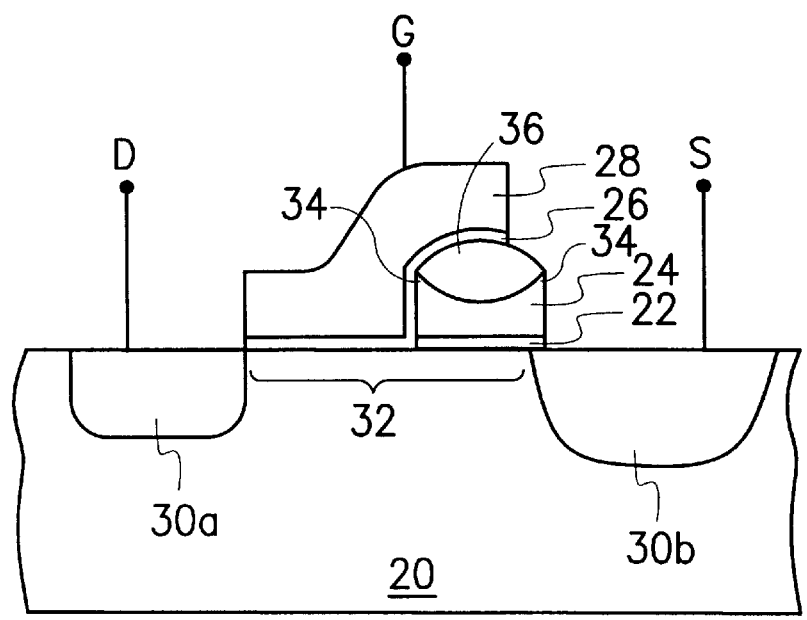
FIG. 2 shows a cross sectional view of a conventional split gate flash memory.
Figure 3A:
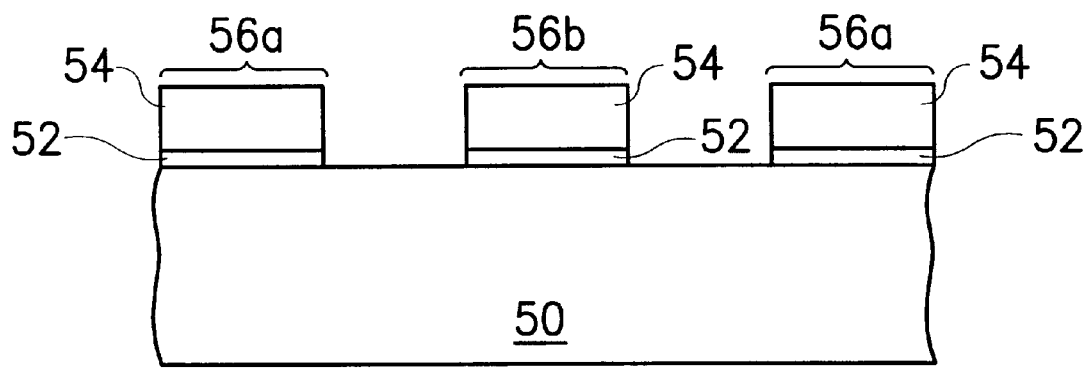
FIG. 3A to FIG. 3I are cross sectional views showing a fabrication method of a flash memory with a split gate structure according to an embodiment of the invention.

FIG. 3A to FIG. 3I illustrates an embodiment for fabricating a flash memory with a split gate. In FIG. 3A, a semiconductor substrate 50 is provided. First insulation blocks 56a and second insulation blocks 56b are formed on the substrate 50. Each of the first and the second insulation blocks 56a and 56b comprises two insulation layers 52 and 54. The insulation layer 52 can be made of silicon oxide, while the insulation layer 54 can be made of silicon nitride. The formation steps of the first and the second insulation blocks 56a and 56b comprise forming the insulation layers 52 and 54, followed by a photolithography and etching step. The first and the second insulation blocks 56a and 56b are alternately arranged on the substrate 50 with a space distant away from each other. That is, a first insulation block 56a is arranged between two second insulation blocks 56b, and a second insulation block 56b is arranged between two first insulation blocks 56a. Between each two neighboring insulation blocks 56a and 56b, the substrate 50 has a surface exposed at the space.

Figure 3B:
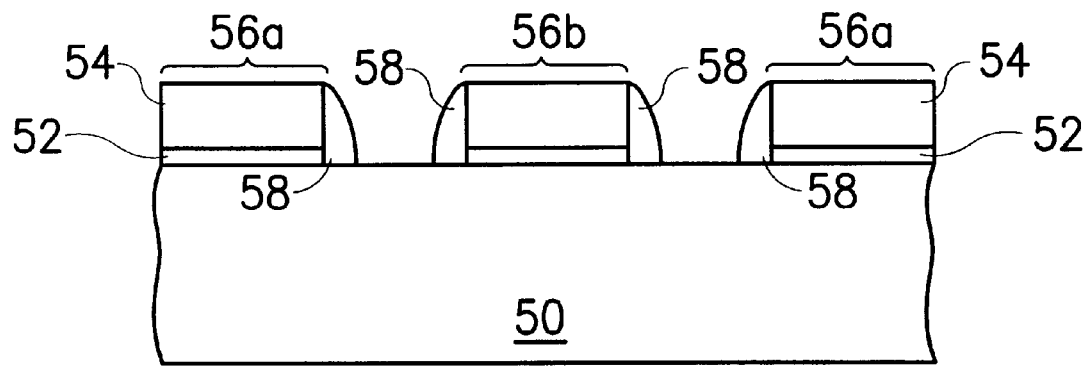

In FIG. 3B, spacers 58 are formed on sidewalls of the first and the second insulation blocks 56a and 56b, so that the space is reduced. The material of the spacers 58 includes, for example, silicon nitride. The spacers 58 can be fabricated by forming a silicon nitride layer by chemical vapor deposition first. Using anisotropic etching, the silicon nitride layer covering the substrate 50 and the upper side of insulation layer 54 is removed.

Figure 3C:
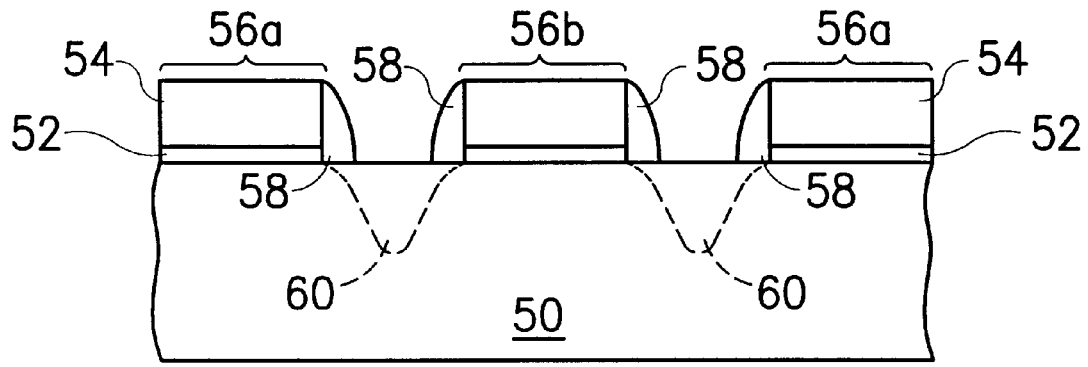

In FIG. 3C, a delta doping step, for example, an ion implantation, is performed to form doped regions 60 in the substrate 50 under the exposed surface between a pair of spacers 58 on sidewalls of each two neighboring insulation blocks 56a and 56b. With the first and the second insulation blocks 56a and 56b and the spacers 58 as a mask, each of the doped regions 60 has a reverse triangle profile. The doped regions 60 are formed for the effect of anti-punch through. The reverse triangle profile has a better effect in anti-punch through than those having a belt shape and can effectively reduce the junction capacitance. The step of delta doping may further adjust the threshold voltage.

Figure 3D:
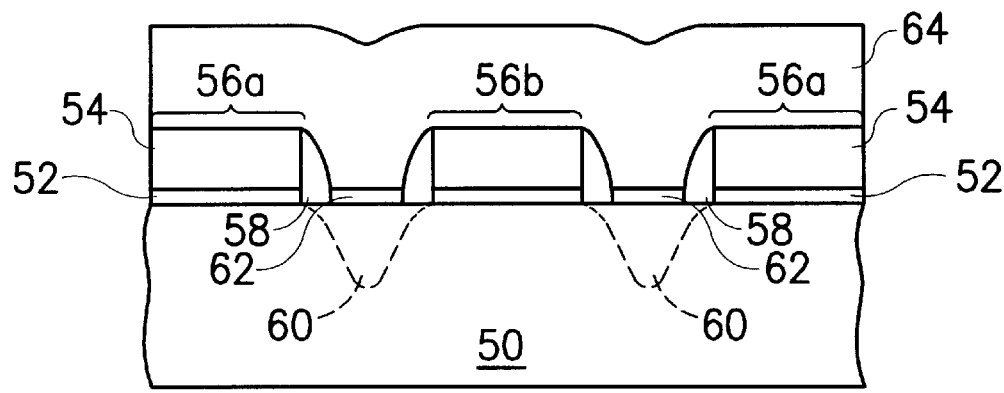

In FIG. 3D, a tunneling oxide layer 62 is formed on the exposed surface of the substrate 50. The method for forming the tunneling oxide layer 62 includes, for example, thermal oxidation at a temperature of about 800–900 degree Celsius. The thickness of the tunneling oxide layer 62 is preferably of about 75–95 angstroms. Apart from thermal oxidation, other method such as low pressure chemical vapor deposition (LPCVD) can also be used to form the tunneling oxide layer 62. A polysilicon layer 64 with a thickness of about 1100–1300 angstroms is then formed on the tunnel oxide layer 62, the insulation blocks 56a, 56b and the spacers 58. The method for forming the polysilicon layer 64 includes, for example, low pressure chemical vapor deposition.

Figure 3E:
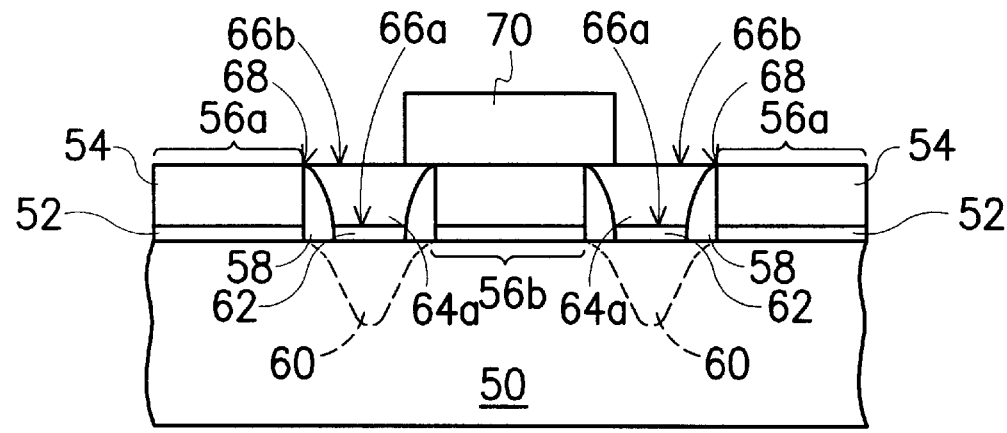

In FIG. 3E, the polysilicon layer 64 is etched using, for example, etch back or chemical mechanical polish (CMP), until the insulation layer 54 is exposed. The remaining polysilicon layer denoted as 64a thus serves as a floating gate of the flash memory which is to be formed. Due to the formation of the spacers 58, the remaining polysilicon layer 64a, that is, the floating gate, is formed with a funnel shape. The floating gate 64a has a gradually diffusing profile from a bottom surface 66a to a top surface 66b. In addition, the funnelform or flaring floating gate 64a has a very sharp annulus tip 68 on a rim of the top surface 66b due to the geometry of the spacers 58. Using a photolithography and etching step, a photoresist layer 70 is formed to cover the second insulation blocks 56b and the spacers 58 on sidewalls of the second insulation blocks 56b, while the first insulation blocks 56a and portions of the top surface 66b are remained exposed.

Figure 3F:
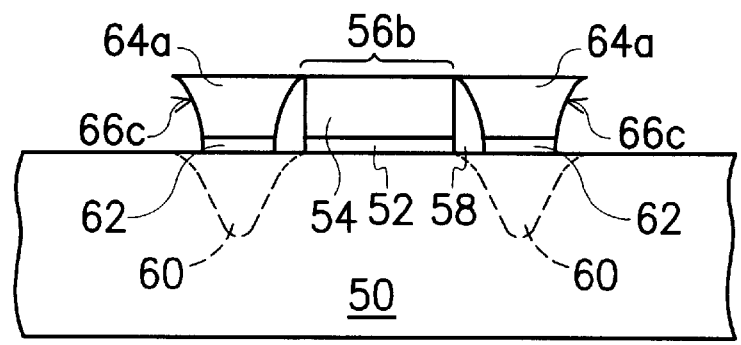

In FIG. 3F, an etching step is performed to remove the first insulation blocks 56a including the spacers 58 on the sidewalls thereof using the photoresist layer 70 as a mask. The first insulation blocks 56a can be removed using a wet etching step with etchant such as hot phosphoric acid for the insulation layer 54 and the spacers 58 and hydrogen fluoride (HF) for the insulation layer 52. As a result, the substrate 50 at two sides of the floating gate 64a is exposed, and a sidewall 66c of the floating gate 64a is also exposed.

Figure 3G:
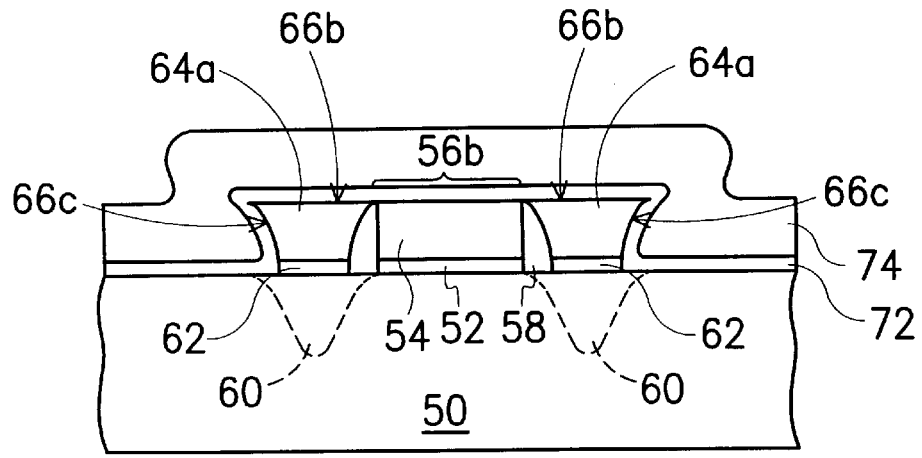

In FIG. 3G, a conformal dielectric layer 72 is formed. The dielectric layer 72, as shown in the figure, extends along the exposed surface of the substrate 50, the sidewall 66c and the top surface 66b of the float gate 64a, and the surface of the second insulation block 56b. A second polysilicon layer 74 is formed on the dielectric layer 72. The material of the dielectric layer 72 includes high temperature oxide (HTO) formed by high temperature low pressure chemical vapor deposition at a temperature of about 900–1000 degree Celsius. Since the high temperature oxide has a promising step coverage, so that the second polysilicon layer 74 can cover the dielectric layer 72 over the substrate 50, the sidewall 66c and the top surface 66b of the floating gate 64a, and the second insulation block 56b. The dielectric layer 72 may be a structure such as a pure oxide layer or an oxide/nitride/oxide (ONO) formed by exposing a silicon layer under an environment of nitrogen and ammonia at a temperature of about 850–900 degree Celsius, so that a part of the oxide layer is nitridized.

Figure 3H:
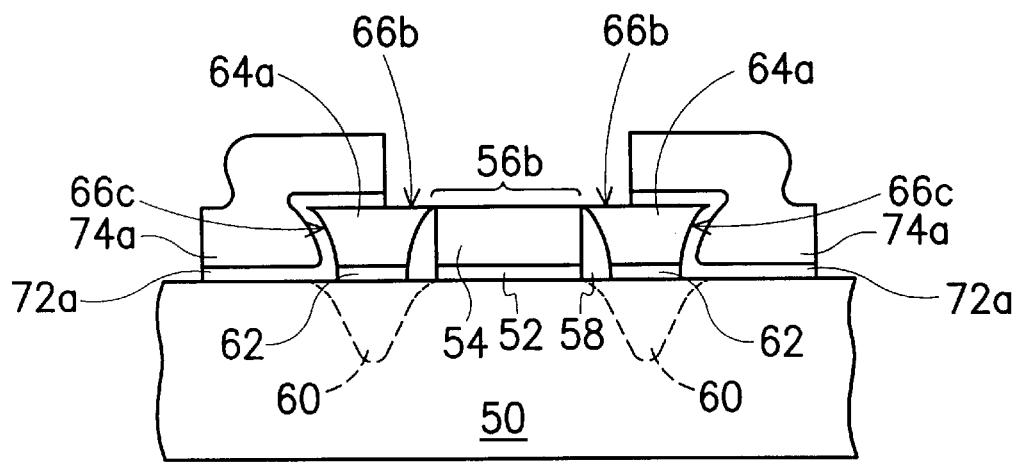

In FIG. 3H, the second polysilicon layer (74 as shown in FIG. 3G) and the dielectric layer (72 as shown in FIG. 3G) are patterned as the control gate 74a covering the dielectric layer 72a. The control gate 74a is over at least a part of the top surface 66a and the sidewall 66c uncovered by the spacers 58 of the floating gate 64a. As a result, the floating gate 64a has one sidewall covered by the spacer 58 and the other sidewall covered by the dielectric layer 72a and the control gate 74a. The tunneling oxide layer 52, the floating gate 64a having one sidewall covered by the spacer 58, the dielectric layer 72a and the polysilicon layer 74a thus form a split gate structure.

Figure 3I:
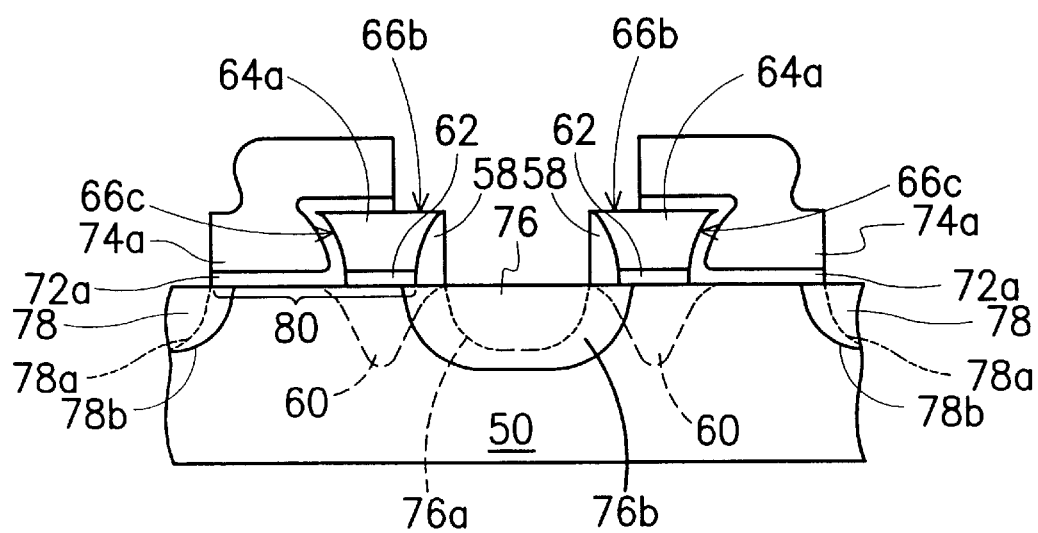

In FIG. 3I, an anisotropic dry etching step is performed to remove the second insulation block 56b, so as to expose the substrate 50 between of every two neighboring split gate structures. A doping step is performed on the exposed substrate 50 with the split gates structure as a mask to form doped regions 76 and 78. The profiles of the doped region 76 and 78 are diffused from 76a and 78a into 76b and 78b after performing an anneal step. Therefore, diffusion regions 76 and 78 are formed in the substrate 50. Preferably, the diffusion regions 76 between two neighboring split gate structures with the sidewalls of the floating gates 64a covered by the spacers 58 serve as source regions. In contrast, the diffusion regions 78 formed between two neighboring split gate structures with the sidewalls of the floating gate 64a covered by the control gate 74a serve as drain regions. A channel region 80 is thus located between the source region 76 and the drain region 78, while the anti-punch through doped region 60 is located under the floating gate 64a.

In the invention, the floating gate has a very sharp annulus tip at a rim of the top surface thereof. Compared to the tip formed by the conventional method, the annulus tip is sharper and formed without an additional oxidation step. The formation of the annulus does not require any thermal process, so that the erasing voltage is reduced and the erasing speed is enhanced without suffering from the limitation of integration and the need of lowering thermal budget.

With the formation of the spacers on sidewalls of the floating gates, anti-punch through implanted regions are formed with a reverse triangular profile. Therefore, the source line capacitance is reduced, and it also prevents the punch through between the source voltage and the drain voltage while programming with an applied source applied voltage.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A flash memory with a split gate structure formed on a substrate, the flash memory comprising:

a channel region in the substrate;

a tunneling oxide, covering a first part of the channel region;

a floating gate, having a gradually diffusion profile from a bottom surface of the floating gate beside the substrate to a top surface of the floating gate opposite to the bottom surface;

a spacer, covering a first sidewall of the floating gate;

a dielectric layer, covering the top surface of the floating gate and a second sidewall of the floating gate and a second part of the channel region;

a control gate, on the dielectric layer; and a source region, in the substrate next to the spacer on the first sidewall of the floating gate, and a drain region, in the substrate next to the control gate over the second sidewall of the floating gate.

2. The flash memory according to claim 1, comprising further a doped region with a reverse triangular profile in the substrate under the floating gate.

3. The flash memory according to claim 1, wherein the floating gate has a funnel shape.

4. The flash memory according to claim 1, comprising further an annulusg top at a rim of the top surface of the floating gate.

5. A split gate structure suitable for use in a flash memory on a substrate, the split gate structure comprising:

a tunneling oxide on the substrate;

a floating gate on the tunneling oxide, having a funnel profile with a larger bottom surface of the floating gate beside the substrate and a smaller top surface of the floating gate opposite to the bottom surface, the floating gate further having a first sidewall covered by a spacer and a second sidewall;

a dielectric layer, formed on the top surface and the second sidewall of the floating gate and extending on a part of the substrate uncovered by the tunneling oxide next to the second sidewall; and a control gate on the dielectric layer.

6. The split gate structure according to claim 5, comprising further a doped region with a reverse triangular profile in the substrate under the floating gate.

7. The split gate structure according to claim 5, wherein the doped region is formed by performing a delta doping step.

8. The split gate structure according to claim 5, comprising further an annulus tip at a rim of the top surface of the floating gate.

* * * * *